United States Patent [19]

Lin et al.

[11] Patent Number: 5,246,883
[45] Date of Patent: Sep. 21, 1993

[54] SEMICONDUCTOR CONTACT VIA STRUCTURE AND METHOD

[75] Inventors: Yih-Shung Lin, Carrollton; Lun-Tseng Lu, Grand Prairie; Fu-Tai Liou, Carrollton; Che-Chia Wei, Plano; John L. Walters, Carrollton, all of Tex.

[73] Assignee: SGS-Thomson Microelectronics, Inc., Carrollton, Tex.

[21] Appl. No.: 832,088

[22] Filed: Feb. 6, 1992

[51] Int. Cl.$^5$ ............................ H01L 21/302
[52] U.S. Cl. ........................ 437/195; 437/228; 437/947; 156/653
[58] Field of Search .............. 437/195, 228, 924, 947, 437/981, 984, 52, 240; 156/651, 652, 653, 657

[56] References Cited

U.S. PATENT DOCUMENTS

| | | | |
|---|---|---|---|
| 4,372,034 | 2/1983 | Bohr | 437/947 |
| 4,824,767 | 4/1989 | Chambers et al. | 430/313 |
| 5,041,397 | 8/1991 | Kim et al. | 437/240 |

FOREIGN PATENT DOCUMENTS

| | | | |
|---|---|---|---|
| 61-166031 | 7/1986 | Japan | 437/981 |
| 62-1246 | 1/1987 | Japan | 437/240 |
| 62-166523 | 7/1987 | Japan | . |
| 63-182839 | 7/1988 | Japan | 437/981 |
| 63-276246 | 11/1988 | Japan | 437/981 |
| 1-233724 | 9/1989 | Japan | 437/947 |

*Primary Examiner*—T. N. Quach
*Attorney, Agent, or Firm*—Kenneth C. Hill; Lisa K. Jorgenson; Richard K. Robinson

[57] ABSTRACT

A method is provided for forming contact vias in an integrated circuit. Initially, a first buffer layer is formed over an insulating layer in an integrated circuit. The first buffer layer has a different etch rate from the insulating layer. A second buffer layer is then formed over the first buffer layer, with the second buffer layer having an etch rate which is faster than the first buffer layer. An isotropic etch is performed to create an opening through the second buffer layer and a portion of the first buffer layer. Because the second buffer layer etches faster than the first buffer layer, the slant of the sidewalls of the opening can be controlled. An anisotropic etch is then performed to complete formation of the contact via.

15 Claims, 2 Drawing Sheets

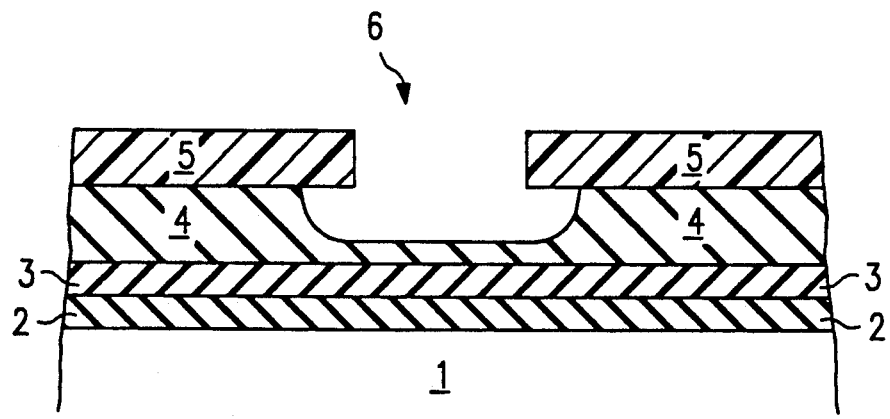
FIG. 1
(PRIOR ART)
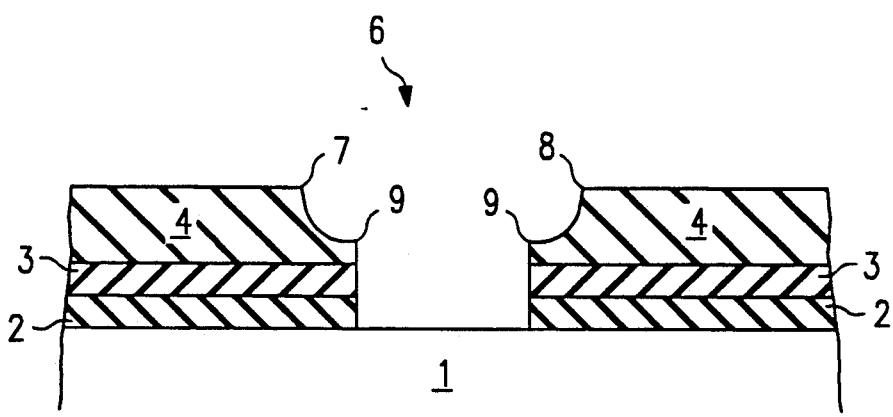
FIG. 2
(PRIOR ART)
FIG. 3
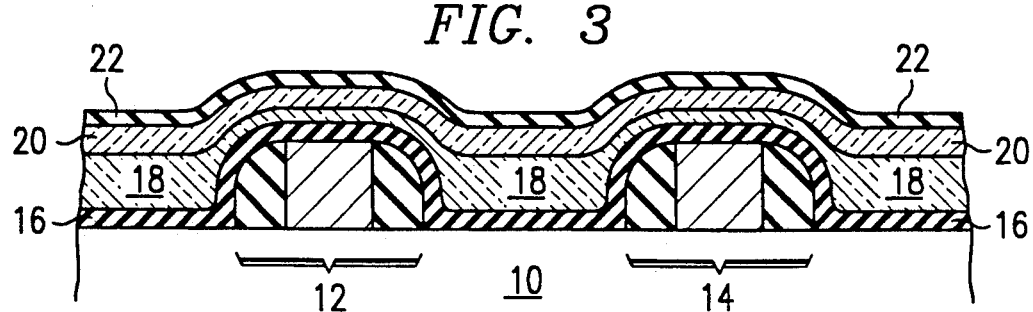

SEMICONDUCTOR CONTACT VIA STRUCTURE AND METHOD

BACKGROUND OF THE INVENTION

1. Field of the Invention

The present invention relates generally to integrated circuits, and more specifically to a method for forming contact vias in integrated circuits.

2. Description of the Prior Art

As integrated circuit devices become more complex, greater numbers of interconnect layers are required to connect the various sections of the device. Generally contact vias are formed between interconnect layers to connect one layer to another. When multiple layers of interconnect are used in this manner, difficulties arise in forming upper interconnect layers and contact vias due to the uneven topographical features caused by the lower interconnect layers. The uneven topographical features of multiple interconnect layers are caused by forming the various interconnect layers above each other, resulting in the creation of hills and valleys on the surface of the device. Thus, the topography of contact vias and interconnect layers affects the ease of manufacturing of the integrated circuit device.

Those skilled in the art will recognize it is difficult to get upper interconnect layers to maintain constant cross-sections when crossing over uneven topography. This leads to portions of the interconnect signal lines having a higher current density, leading to electromigration problems and related device failure mechanisms. Furthermore, step coverage problems can result in voids and other defects in the interconnect signal lines themselves, and in the contact vias formed between the interconnect lines.

During the manufacturing process it is common to perform various techniques in an attempt to maintain a more planar topography. One technique known in the art is the deposition of phosphorous or boron doped reflow glass. The reflow glass tends to cover the hills and fill in the valleys on the surface of the device, resulting in a more planar surface. This technique however, requires a high temperature treatment in order for the glass to flow and stabilize. The high temperature treatment can be undesirable when the manufacturing process also requires silicidation of a refractory metal. Typically, refractory metals silicided can not sustain high temperatures.

Another problem encountered when forming contact vias is the creation of sharp corners in the sidewalls of the opening. Those skilled in the art will recognize that it is difficult to get overlying layers to adequately cover the sharp corners. For example, when aluminum is deposited over a via with sharp corners, the layer is thinner at the sharp corners. This thinning of the layer can also cause electromigration problems and related device failure mechanisms.

Various techniques are used to alleviate the formation of sharp corners in vias. In one technique the contact via is formed by first performing an isotropic etch through a portion of a layer, followed by an anisotropic etch to complete formation of the opening. As those skilled in the art know, the resulting contact profile is not always free from sharp corners. Sharp corners can be formed at the top edges of the portions of the opening that are formed by the isotropic etch and the anisotropic etch.

Therefore, it would be desirable to provide a method for forming contact vias which are free from sharp corners and also result in a planarized topography. It is also desirable that such a method can be performed at low to medium temperatures. Finally, it is desirable that such a method not significantly increase the complexity of the manufacturing process.

SUMMARY OF THE INVENTION

According to the present invention, a method is provided for forming contact vias in an integrated circuit. Initially, a first buffer layer is formed over an insulating layer in an integrated circuit. The first buffer layer has a different etch rate from the insulating layer. A second buffer layer is then formed over the first buffer layer, with the second buffer layer having an etch rate which is faster than the first buffer layer. An isotropic etch is performed to create an opening through the second buffer layer and a portion of the first buffer layer. Because the second buffer layer etches faster than the first buffer layer, the slant of the sidewalls of the opening can be controlled. An anisotropic etch is then performed to complete formation of the contact via.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

FIGS. 1-2 are sectional views of an integrated circuit illustrating a prior art method of forming a contact via; and FIGS. 3-7 are sectional views of an integrated circuit illustrating a preferred method for forming contact vias according to the present invention.

DESCRIPTION OF THE PREFERRED EMBODIMENT

Figure 4:
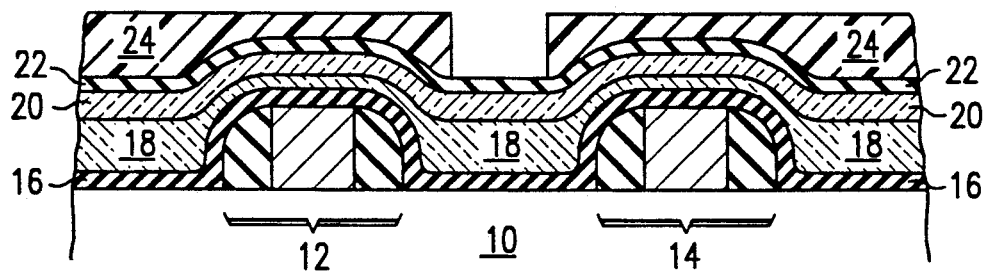

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

FIGS. 1 and 2 depict a prior art method for forming a contact via structure in an integrated circuit. Referring to FIG. 1, a contact structure will be built on an underlying region 1 in an integrated circuit. The underlying region 1 can be either a semiconductor substrate or an underlying interconnect layer. An insulating layer 2 is deposited over the device, followed by a first buffer layer 3. A second buffer layer 4 is then deposited over the first buffer layer 3. A photoresist mask 5 is deposited on the second buffer layer 4, and patterned to define the location of a contact via. An opening 6 is created in the second buffer layer 4 by performing an isotropic etch. As can be seen, the sidewalls of the opening 6 are curved and sharp corners 7,8 are formed as a result of the isotropic etch. Those skilled in the art will recognize that the sharp corners 7,8 can cause step coverage problems.

FIG. 2 illustrates the device after an anisotropic etch is performed to complete formation of the contact via 6, and the photoresist mask 5 is removed. The anisotropic etch also creates sharp corners 9 in the sidewalls of the contact via 6. Again, the sharp corners 9 can cause step coverage problems.

FIGS. 3-7 depict a preferred method for forming contact vias in an integrated circuit. Referring to FIG. 3, a contact structure will be built on an underlying region 10 in an integrated circuit. The underlying region 10 can be either a semiconductor substrate or an underlying interconnect layer. Interconnect or component structures 12, 14 are formed on the underlying region 10. An insulating layer 16 is then deposited over the device. A planarizing layer 18 is deposited over the insulating layer 16, followed by the deposition of a first buffer layer 20. Finally, a second buffer layer 22 is deposited over the first buffer layer 20. Together the four layers 16, 18, 20, 22 form an interlevel dielectric layer.

In one example of the preferred embodiment, the insulating layer 16 is made of undoped oxide, while the planarizing layer 18 comprises a phosphorus doped spin on glass containing approximately one to two percent phosphorus. The phosphorus doped spin on glass is annealed at approximately 400 to 500 degrees Celsius, and cured at approximately 700 degrees Celsius. An advantage to using the phosphorus doped spin on glass is that it creates a planarized surface at low to medium temperatures. The first buffer layer 20 is preferably made of phosphosilicate glass containing approximately one to four percent phosphorus, and the second buffer layer 22 preferably comprises phosphorus doped oxide containing approximately six to eight percent phosphorus. The first and second buffer layers 20, 22 can be deposited either by atmospheric or low pressure CVD. This results in the second buffer layer 22 having a faster etch rate than the first buffer layer 20.

Selection of the planarizing and buffer layers 18, 20, 22 however, is not limited to these examples. Materials with different etch rates can be used so long as the second buffer layer 22 can be etched faster than the first buffer layer 20. In order to avoid under cutting the contact, it is desirable that the first buffer layer 20 etch slower than the planarizing layer 18. This allows formation of a contact opening having a "y" shaped profile, as will now be described.

FIG. 4 illustrates the device after a photoresist layer 24 is deposited and patterned on the second buffer layer 22. The photoresist layer 24 is patterned and defined using methods known in the art.

Figure 5:
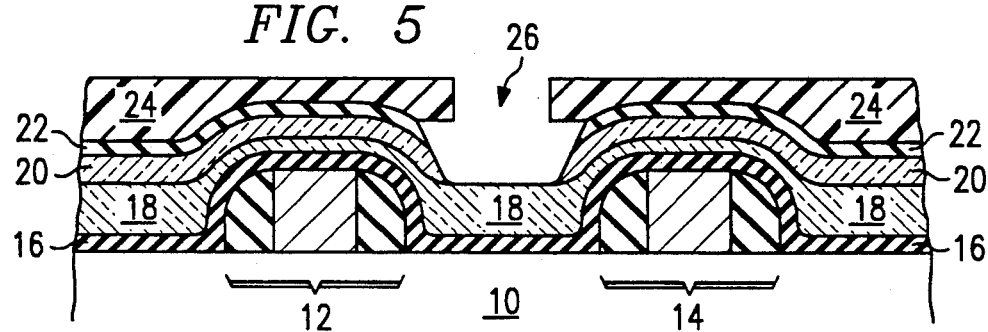

Referring to FIG. 5, an isotropic etch is performed to form an opening 26 through the first and second buffer layers 20,22. The isotropic etch may form opening 26 through the second buffer layer 22 and only a portion of the first buffer layer 20. Because the second buffer layer 22 etches faster than the first buffer layer 22, diagonally sloped sidewalls are created in the opening 26. The diagonally sloped sidewalls help to reduce step coverage problems typically encountered with contact structures.

Figure 6:
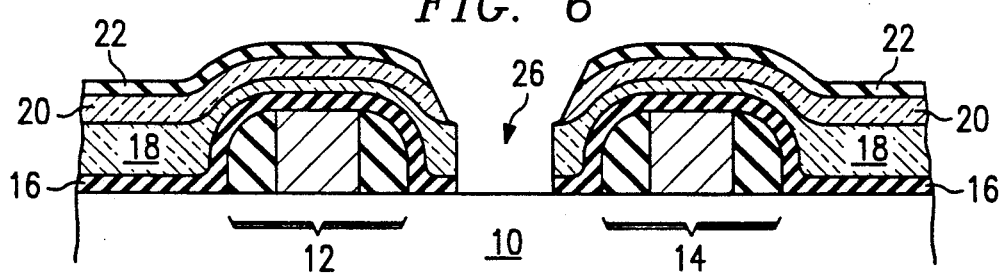

FIG. 6 illustrates the device after an anisotropic etch is performed to complete formation of the opening 26, and the photoresist layer 24 is removed. It is possible to remove the second buffer layer 22 during a contact preclean step, as an alternative to having the second buffer layer 22 remain on the device as shown in FIG. 6.

Figure 7:
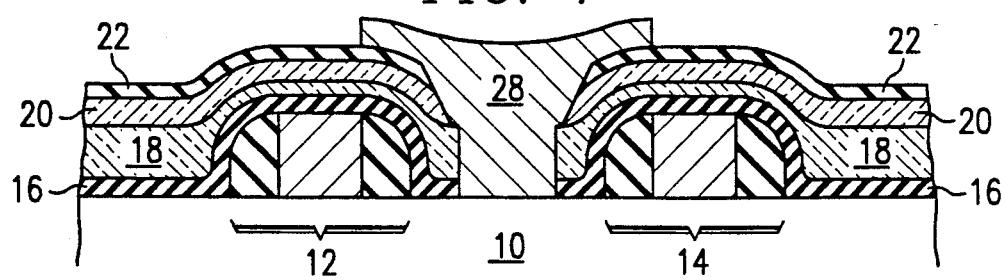

Referring to FIG. 7, a layer of conductive material 28 is deposited and patterned in the opening 26, thereby making electrical contact with the underlying region 10 The integrated circuit is now ready for further processing steps.

The above described process provides a method for controlling the slope of the sidewalls in a contact structure. By selecting materials with varying etch rates, the slope of the vertical sidewalls in the contact structure can be controlled. Those skilled in the art will recognize that controlling the slope of the sidewalls helps in alleviating step coverage problems. This has the desirable effect of creating a planarized topography. Furthermore, the process is done at low to medium temperatures, a desirable feature for manufacturing processes requiring silicidation of refractory metals.

While the invention has been particularly shown and described with reference to a preferred embodiment, it will be understood by those skilled in the art that various changes in form and detail may be made therein without departing from the spirit and scope of the invention.

What is claimed is:

1. A method for forming a contact structure in an integrated circuit, comprising the steps of:
    forming an insulating layer over an underlying region in the integrated circuit;
    forming a planarizing layer having a first etch rate over the insulating layer;
    forming a first buffer layer having a second etch rate over the planarizing layer, wherein the first buffer layer is removed slower than the planarizing layer during a etch step;
    forming a second buffer layer having a third etch rate over the first buffer layer, wherein the second buffer layer is removed faster than the first buffer layer during an etch step; and
    forming an opening through the second and first buffer layers, the planarizing layer, and the insulating layer by performing an isotropic etch through the second and first buffer layers, followed by an anisotropic etch through the planarizing layer and insulating layer to expose a portion of the underlying region.

2. The method of claim 1, wherein said step of forming the insulating layer comprises depositing a layer of undoped oxide over the underlying region in the integrated circuit.

3. The method of claim 2, wherein said underlying region comprises a semiconductor substrate.

4. The method of claim 1, wherein said step of forming the planarizing layer comprises depositing a layer of spin on glass.

5. The method of claim 4, wherein said spin on glass comprises a layer of phosphorus doped spin on glass.

6. The method of claim 1, wherein said step of forming the first buffer layer comprises depositing a layer of phospho-silicate glass.

7. The method of claim 1, wherein said step of forming the second buffer layer comprises depositing a layer of phosphorus doped oxide that is more highly doped than the first buffer layer.

8. The method of claim 1, wherein a conductive layer is deposited and patterned over a portion of the second buffer layer and extends into the opening to make electrical contact with the underlying region.

9. The method of claim 1, further comprising the step of removing the second buffer layer after forming the opening through the second and first buffer layers, the planarizing layer and the insulating layer.

10. The method of claim 9, further comprising the step of depositing and patterning a conductive layer over a portion of the first buffer layer, wherein the conductive layer extends into the opening to make electrical contact with the underlying region.

11. A method for forming a contact structure in an integrated circuit, comprising the steps of:
   forming an insulating layer over an underlying region in the integrated circuit;
   forming a first buffer layer having a first etch rate over the insulating layer;
   forming a second buffer layer having a second etch rate over the first buffer layer, wherein the second buffer layer is removed faster than the first buffer layer during an etch step; and
   forming an opening through the second and first buffer layers and the insulating layer by performing an isotropic etch through the second and first buffer layers, followed by an anisotropic etch through the insulating layer to expose a portion of the underlying region.

12. The method of claim 11, further comprising the step of forming a planarizing layer having a third etch rate over the insulating layer before forming the first buffer layer, wherein the first buffer is removed slower than the planarizing layer during an etch step, and wherein the opening is formed through the planarizing layer during the anisotropic etch.

13. The method of claim 11, further comprising the step of depositing and patterning a conductive layer over a portion of the second buffer layer and extending into the opening to make electrical contact with the underlying region.

14. The method of claim 11, wherein the second buffer layer is removed after forming the opening.

15. The method of claim 14, wherein a conductive layer is deposited and patterned over a portion of the first buffer layer and extending into the opening to make electrical contact with the underlying region.

* * * * *